(12) United States Patent
Strukov et al.

(10) Patent No.: US 8,530,880 B2
(45) Date of Patent: Sep. 10, 2013

(54) RECONFIGURABLE MULTILAYER CIRCUIT

(75) Inventors: Dmitri Borisovich Strukov, Mountain View, CA (US); R. Stanley Williams, Portola Valley, CA (US); Yevgeniy Eugene Shteyn, Cupertino, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 52 days.

(21) Appl. No.: 13/259,168

(22) PCT Filed: Jul. 27, 2009

(86) PCT No.: PCT/US2009/051835
§ 371 (c)(1),
(2), (4) Date: Sep. 23, 2011

(87) PCT Pub. No.: WO2011/014156
PCT Pub. Date: Feb. 3, 2011

(65) Prior Publication Data
US 2012/0007038 A1  Jan. 12, 2012

(51) Int. Cl.
*H01L 29/06* (2006.01)
*H03K 19/177* (2006.01)
*H03K 25/00* (2006.01)
*H03K 19/173* (2006.01)

(52) U.S. Cl.
USPC ............ 257/5; 326/36; 326/41; 326/46

(58) Field of Classification Search
USPC ................. 257/5, E27.004; 326/41
See application file for complete search history.

(56) References Cited

U.S. PATENT DOCUMENTS

| | | | |
|---|---|---|---|
| 5,886,371 A * | 3/1999 | Shinagawa | 257/207 |
| 7,073,157 B2 | 7/2006 | DeHon et al. | |
| 7,378,870 B2 | 5/2008 | Mouttet | |
| 2003/0039924 A1 * | 2/2003 | Maimon et al. | 430/318 |
| 2003/0127678 A1 * | 7/2003 | Shimizu et al. | 257/306 |
| 2005/0055387 A1 | 3/2005 | Kuekes et al. | |
| 2005/0224982 A1 * | 10/2005 | Kemerling et al. | 257/758 |
| 2006/0214683 A1 | 9/2006 | DeHon | |
| 2007/0152338 A1 * | 7/2007 | Kim | 257/758 |
| 2008/0079029 A1 | 4/2008 | Williams | |
| 2008/0090337 A1 | 4/2008 | Williams | |
| 2008/0197333 A1 * | 8/2008 | Lung | 257/2 |
| 2008/0258767 A1 | 10/2008 | Snider et al. | |
| 2010/0159688 A1 * | 6/2010 | Rinerson et al. | 438/598 |

OTHER PUBLICATIONS

Snider et al, "Nano/CMOS architectures using a field-programmable nanowire interconnect", Nanotechnology, vol. 18, 035204 (2007).*
Strukov, D.B. et al.; "Reconfigurable Hybrid CMOS/Nanodevice Circuits for Image Processing"; 2007; IEEE.
Snider, G.S. et al.; "Nano/CMOS architectures using a field-programmable nanowire interconnect": Jan. 3, 2007; IOP Publishing Ltd.

(Continued)

*Primary Examiner* — Long K Tran
*Assistant Examiner* — Dzung Tran

(57) ABSTRACT

A reconfigurable multilayer circuit (400) includes a complimentary metal-oxide-semiconductor (CMOS) layer (210) having control circuitry, logic gates (515), and at least two crossbar arrays (205, 420) which overlie the CMOS layer (210). The at least two crossbar arrays (205, 420) are configured by the control circuitry and form reconfigurable interconnections between the logic gates (515) within the CMOS layer (210).

16 Claims, 9 Drawing Sheets

(56) References Cited

OTHER PUBLICATIONS

Strukov, Dmitri et al.: "Capacitive Crossbar Arrays": PCT Application No. PCT/US2009/047164 filed on Jun. 12, 2009.
Strukov, Dmitri et al.; "Three Dimensional Multilayer Circuit"; PCT Application No. PCT/US2009/039666 filed on Apr. 6, 2009.
ISA 220 ISR & Written Opinion, WO Search Report.
Afifi, Ahmad, Ahmad Ayatollahi, and Farshid Raissi. "STDP implementation using memristive nanodevice in CMOS-Nano neuromorphic networks." IEICE Electronics Express 6.3 (2009): 148-153.
Cortical Computing with Memristive Nanodevices, SciDAC Review, Winter 2008, pp. 58-65. (See fig. 9, p. 64).
International Search Report, (Mar. 24, 2010) Hewlett-Packard Development Company, L.P., PCT Application No. PCT/US2009/051835, filed Jul. 27, 2009.
Jo, Sung Hyun, Kuk-Hwan Kim, and Wei Lu. "High-density crossbar arrays based on a Si memristive system." Nano Lett 9.2 (2009): 870-874.
Linares-Barranco, Bernabé, and Teresa Serrano-Gotarredona. "Memristance can explain spike-time-dependent-plasticity in neural synapses." Nature precedings (2009): 1-4.
Snider, Greg S. "Spike-timing-dependent learning in memristive nanodevices." Nanoscale Architectures, 2008. NANOARCH 2008. IEEE International Symposium on. IEEE, 2008.

\* cited by examiner

RECONFIGURABLE MULTILAYER CIRCUIT

BACKGROUND

In the past decades, the semiconductor industry has been improving the performance and density of integrated circuits primarily by shrinking the size of the electronic elements within the circuits. However, a number of barriers are becoming evident which increase the difficulty of making further reduction to the size of these elements. One potential solution for increasing the performance and planar density of integrated circuits is to create multilayer circuits which are made up of a number of vertically integrated layers.

The flexibility and efficiency of a multilayer circuit can be improved if the multilayer circuit can be reconfigured. This reconfiguration can allow the multilayer circuit to adapt to a specific task or program.

BRIEF DESCRIPTION OF THE DRAWINGS

The accompanying drawings illustrate various embodiments of the principles described herein and are a part of the specification. The illustrated embodiments are merely examples and do not limit the scope of the claims.

Throughout the drawings, identical reference numbers designate similar, but not necessarily identical, elements.

DETAILED DESCRIPTION

Figure 1:
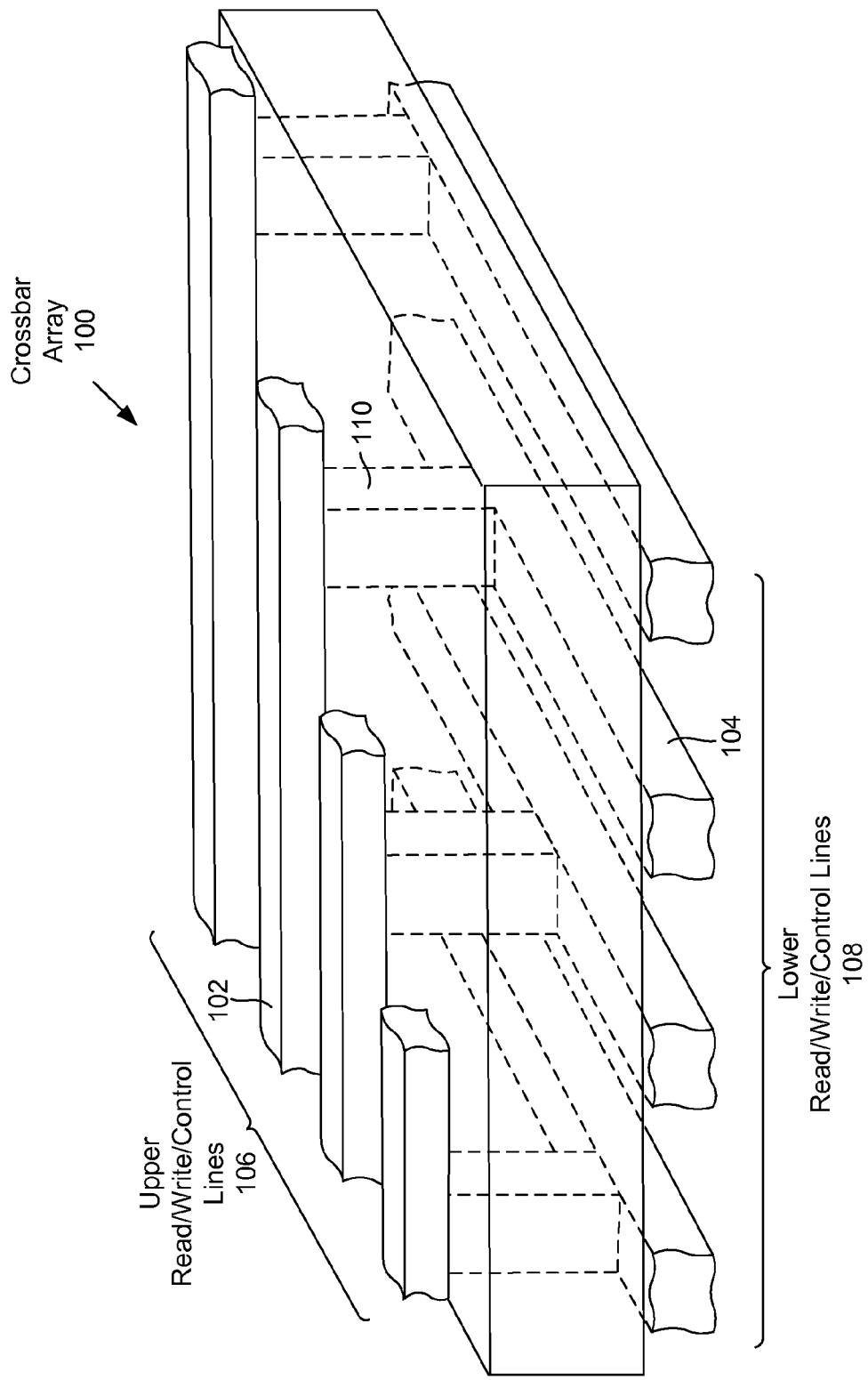
FIG. 1 is a perspective view of an illustrative crossbar array, according to one embodiment of principles described herein.

In the past decades, the semiconductor industry has been improving the performance and density of integrated circuits primarily by shrinking the size of the electronic elements within the circuits. However, a number of barriers are becoming evident which increase the difficulty of making further reduction to the size of these elements. One potential solution for increasing the performance and planar density of integrated circuits is to create three dimensional circuits which contain multiple layers of interconnected circuitry.

The multilayer circuit described below is a hybrid of CMOS circuitry and crossbar arrays which provides higher density in digital memories and dramatically improves the density of field programmable logic. According to one illustrative embodiment, a number of crossbar arrays are stacked vertically above an area distributed CMOS circuit.

According to one illustrative embodiment, the crossbar arrays can be used to form an interconnection fabric which forms reconfigurable connections between logic gates in the CMOS circuit. This interconnection fabric can be reconfigured to alter the architecture and function of the multilayer circuit. In some illustrative embodiments, the crossbar arrays may be configured such that a portion of a crossbar array is used as memory, while the remainder of the crossbar array is used as a programmable interconnect fabric. Additionally or alternatively, the scale of a unit cell within various crossbar arrays may vary to allow additional flexibility in making interconnections between underlying circuit elements.

These reconfigurable multilayer circuits can be used in a variety of applications such as digital signal processing, defense systems, medical imaging, computer vision, speech recognition, cryptography, bioinformatics, and other applications. The reconfigurable multilayer circuits have a number of advantages over traditional solutions such as field programmable gate arrays (FPGAs). Although the FPGAs are configurable after they are manufactured, the elements which provide this configurability can consume as much as 90% of the planar area of the FPGA. This results in a high cost device which has a large footprint.

However, the reconfigurable multilayer circuits described below separate the logic and interconnection functions. The logic remains on the CMOS circuitry, but the interconnection functions are transferred to the overlying crossbar arrays. This relatively clean separation between the logic and interconnection functions provides additional flexibility in configuration and results in a computation device with a much smaller foot print. Additionally, the multilayer circuits may have better scalability and performance than FPGA implementations.

In the following description, for purposes of explanation, numerous specific details are set forth in order to provide a thorough understanding of the present systems and methods. It will be apparent, however, to one skilled in the art that the present apparatus, systems and methods may be practiced without these specific details. Reference in the specification to "an embodiment," "an example" or similar language means that a particular feature, structure, or characteristic described in connection with the embodiment or example is included in at least that one embodiment, but not necessarily in other embodiments. The various instances of the phrase "in one embodiment" or similar phrases in various places in the specification are not necessarily all referring to the same embodiment.

FIG. 1 is a perspective view of an illustrative crossbar array (100). The crossbar array (100) includes a first group of read/write/control lines (106) which are generally parallel. According to one illustrative embodiment, a second group of read/write/control lines (108) are perpendicular to and intersect the first group of lines (106). However, the first and second groups of lines (106, 108) may intersect at any non-zero angle. According to one illustrative embodiment, programmable crosspoint devices (110) are formed at the intersection between an upper line (102) and lower line (104).

According to one illustrative embodiment, the programmable crosspoint devices (110) are memristive devices or memcapacitive devices. Memristive devices exhibit a "memory" of past electrical conditions. For example, a memristive device may include a matrix material which contains mobile dopants. These dopants can be moved within a matrix to dynamically alter the electrical operation of an electrical device. The motion of dopants can be induced by the application of a programming electrical voltage across a suitable matrix. The programming voltage generates a relatively high electrical field through the memristive matrix and alters the distribution of dopants. After removal of the electrical field, the location and characteristics of the dopants remain stable until the application of another programming electrical field. For example, by changing the dopant configurations within a memristive matrix, the electrical resistance of the device may be altered. The memristive device is read by applying a lower reading voltage which allows the internal electrical resistance of the memristive device to be sensed but does not generate a high enough electrical field to cause significant dopant motion. Consequently, the state of the memristive device may remain stable over long time periods and through multiple read cycles. Memristive devices are described in U.S. Patent App. Pub. No. 2008/0079029, entitled "Multi-terminal Electrically Actuated Switch" and U.S. Patent App. Pub. No. 2008/0090337, entitled "Electrically Actuated Switch", both to R. Stanley Williams, which are hereby incorporated by reference in their entireties.

Additionally or alternatively, the programmable crosspoint devices may be memcapacitive devices. According to one illustrative embodiment, memcapacitive devices share operational similarities with memristors, except the motion of dopants within the matrix primarily alters the capacitance of the device rather than its resistance. Various illustrative embodiments of memcapacitive devices are described in PCT Application No. PCT/US2009/047164 to Dmitri Strukov et al., entitled "Capacitive Crossbar Arrays" filed Jun. 12, 2009, which is incorporated by reference in its entirety.

According to one illustrative embodiment, the crossbar architecture (100) may be used to form a nonvolatile memory array. Each of the programmable crosspoint devices (110) may be used to represent one or more bits of data. Although individual crossbar lines (102, 104) in FIG. 1 are shown with rectangular cross sections, crossbars can also have square, circular, elliptical, or more complex cross sections. The lines may also have many different widths, diameters, aspect ratios and/or eccentricities. The crossbars may be nanowires, sub-microscale wires, microscale wires, or wires with larger dimensions.

According to one illustrative embodiment, a crossbar array (100) or other memristive device is integrated into complimentary metal-oxide-semiconductor (CMOS) or other conventional computer circuitry. This CMOS circuitry can provide additional functionality to the memristive device such as input/output functions, buffering, logic, configuration, or other functionality. Multiple crossbar arrays can be formed over the CMOS circuitry to create a multilayer circuit. Various three dimensional circuits which include integrated crossbar arrays are described in PCT Application No. PCT/US2009/039666, to Dmitri Strukov et al., entitled "Three Dimensional Multilayer Circuit," filed Apr. 6, 2009, which is incorporated by reference in its entirety.

Figure 2:
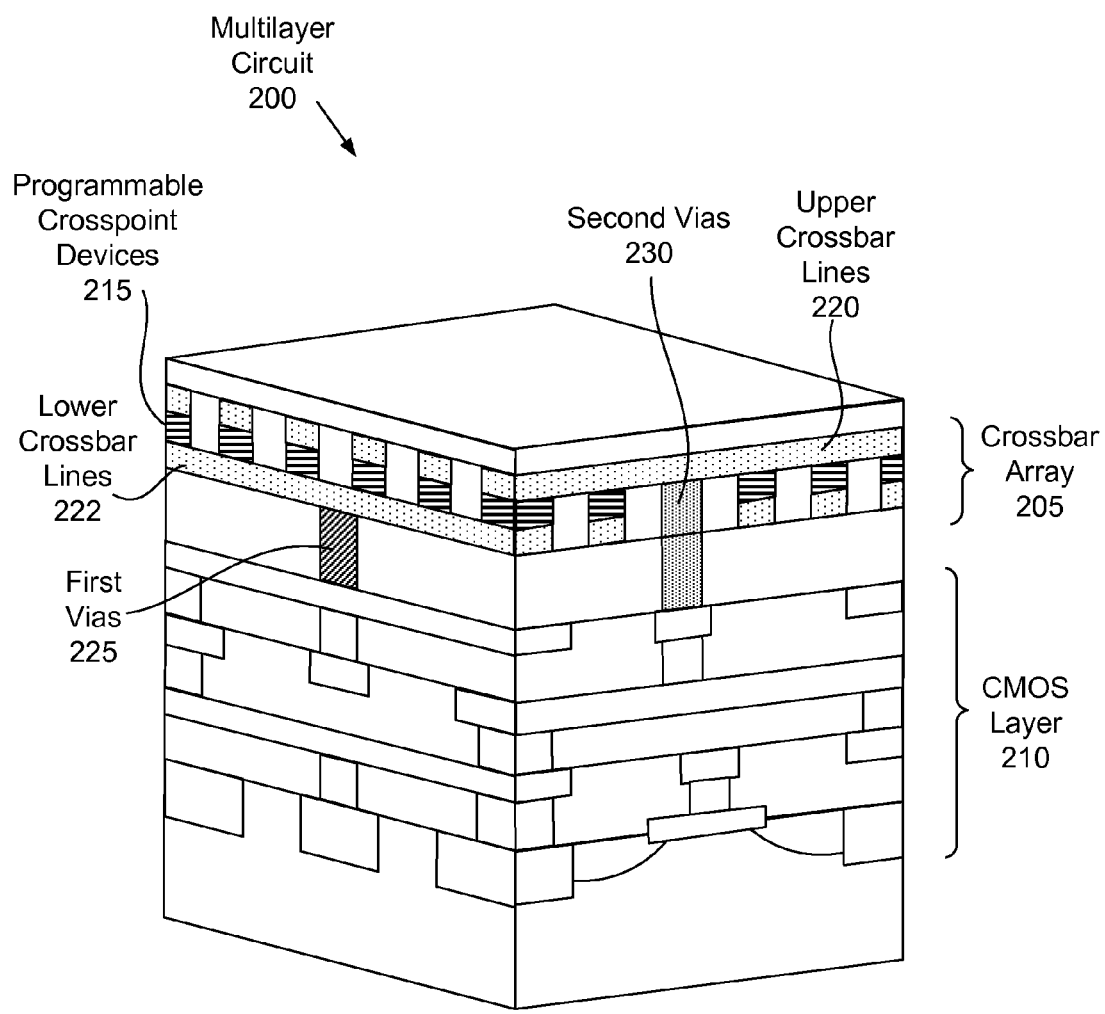
FIG. 2 is a diagram showing a cross-section of an illustrative multilayer circuit which includes a complimentary metal-oxide-semiconductor (CMOS) base layer and an overlying crossbar array layer, according to one embodiment of principles described herein.

FIG. 2 is a diagram showing an illustrative three dimensional multilayer circuit (200) which includes a CMOS layer (210) and an overlying crossbar array (205). As used in the specification and appended claims, a crossbar array includes a set of upper crossbar wires, a set of lower crossbar wires which intersect the upper crossbar wires at a non-zero angle, and programmable crosspoint devices interposed between the wires at the intersections. For example, the crossbar array (205) contains a set of upper crossbar lines (220), a set of lower crossbar lines (222), and a number of programmable crosspoint devices (215) interposed between the upper crossbar lines (220) and the lower crossbar lines (222). The crossbar array (205) is electrically connected to the underlying CMOS layer (210) by two groups of vias (225, 230). A first group of vias (225) connects to the lower crossbar lines (222) and a second group of vias (230) connects to the upper crossbar lines (220).

The CMOS layer (210) illustrated in FIG. 2 is "area distributed" rather than "peripherally distributed." Area distributed CMOS circuitry typically connects to the target circuitry through exposed portions of the target circuitries planar area. The area distributed CMOS circuitry has several distinct advantages over contacting the target circuitry only around its periphery. In peripherally distributed CMOS circuitry, the density at which the CMOS circuitry can be packed around the target circuit can become a limiting factor in the circuit layout. Additionally, peripherally distributed CMOS circuitry can produce a combined circuit which occupies a large planar area, with long control and input/output lines. This leads to large values of line capacitance and resistance, which makes the write and read functions slow and energy intensive.

In contrast, area distributed CMOS circuitry typically underlies the target circuitry and can occupy as much room as the target circuit without increasing the required planar area of the combined circuit. Additionally, by connecting the CMOS circuitry to the overlying target circuit using vias, long connection traces are avoid. By avoiding long connection traces which are inherent in peripherally distributed configurations, the resistance and capacitance of the circuit can be minimized. This reduction in resistance and capacitance makes write and read functions faster and lower energy.

Figure 3:
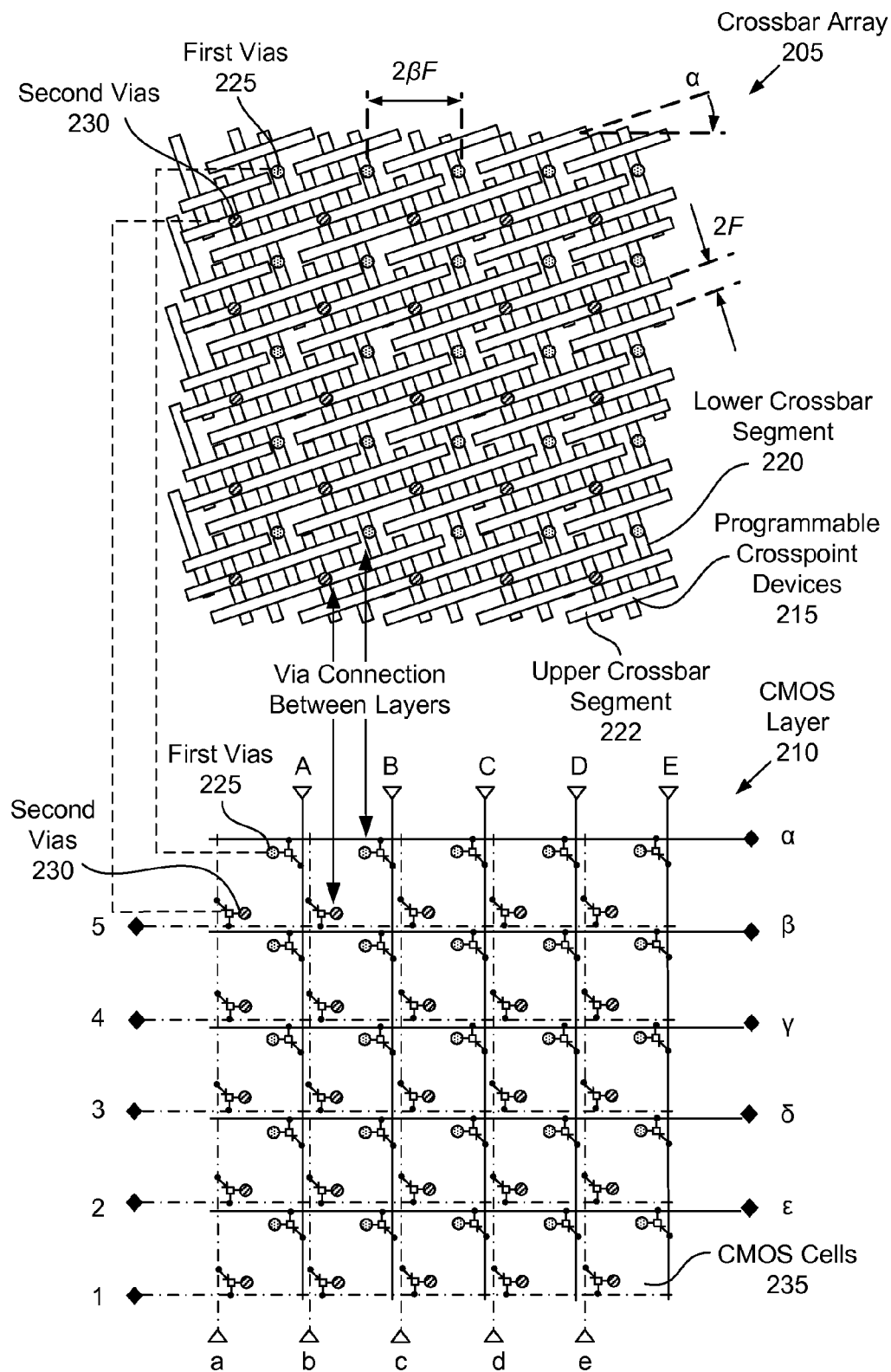
FIG. 3 is a diagram showing one illustrative integration scheme for interconnecting the CMOS layer and the overlying crossbar array, according to one embodiment of principles described herein.

FIG. 3 is a diagram showing one illustrative integration scheme for interconnecting the CMOS layer (210) and the overlying crossbar array (205). The CMOS layer (210) is made up of a number of CMOS cells (235). As used in the specification and appended claims, the term "cell" refers to the smallest repeating unit within an array. According to one illustrative embodiment, each cell (235) contains a first via (225) and a second via (230). The CMOS cell (235) includes two access devices, one for each via in the cell. Four sets of lines provide input, output, and control functionality. For example, the set of first vias (225) are accessed by activating control lines labeled with uppercase Roman letters. Data is input and output from the set of first vias (225) using the input/output lines labeled with lowercase Greek letters. Similarly, the set of second vias (230) are accessed by activating control lines labeled with lowercase Roman letters and data is input/output using lines labeled with Arabic numerals. Lines associated with the set of second vias (230) are illustrated as dash-dot lines to distinguish them from the solid lines associated with the first vias (225).

The combined CMOS cells (235) create an array of vias which is divided into two distinct sets of vias, a set of first vias (225) which connect to lower crossbar segments and a set of second vias (230) which connect to upper crossbar segments. The array of vias pass from the CMOS layer (210) upward into the crossbar array (205) where each via (225, 230) is electrically connected to a crossbar segment (220, 222). According to one illustrative embodiment, the set of first vias (225) are connected to the lower crossbar segments (222) at the mid-point of each segment. Similarly, the set of second vias (230) are connected to the upper crossbar segments (220)

at the mid-point of each segment. A programmable crosspoint device (215) is located at each intersection between an upper crossbar segment (220) and a lower crossbar segment (222).

The pitch between the crossbar segments in the same crossbar array can be as dense as 2 F, where F is the minimum feature size for the process which is used to form the segments. For example, in photolithography the minimum feature size is in the tens of nanometers. According to one illustrative embodiment, the spacing between vias of the same type is approximately 2 βF. This corresponds to the linear size of the underlying CMOS cell. Here β is a dimensionless number larger than 1 that depends on the cell complexity in the CMOS subsystem. The crossbar segments are rotated by angle α=arcsin(1/β) relative to the via array such that the vias naturally divide wires into crossbar segments of the length $β^2 2$ F. Note that factor β is not arbitrary but rather chosen from the spectrum of possible values $β=(r^2+1)^{1/2}$, where r is an integer so that the precise number of devices on the wire fragment is $r^2-1 \approx β^2$. According to one illustrative embodiment, the domain size in each crossbar array is proportional to the square of the quotient of the linear size of the CMOS cell divided by the crossbar wire pitch. For example, the linear size of the CMOS cell may be 2 βF and the crossbar wire pitch may be 2 F. Consequently, the domain size may be given by Eq. 1 below.

$$\text{Domain\_size} \propto \left(\frac{2βF}{2F}\right)^2 \quad \text{Eq. 1}$$

Figure 4:
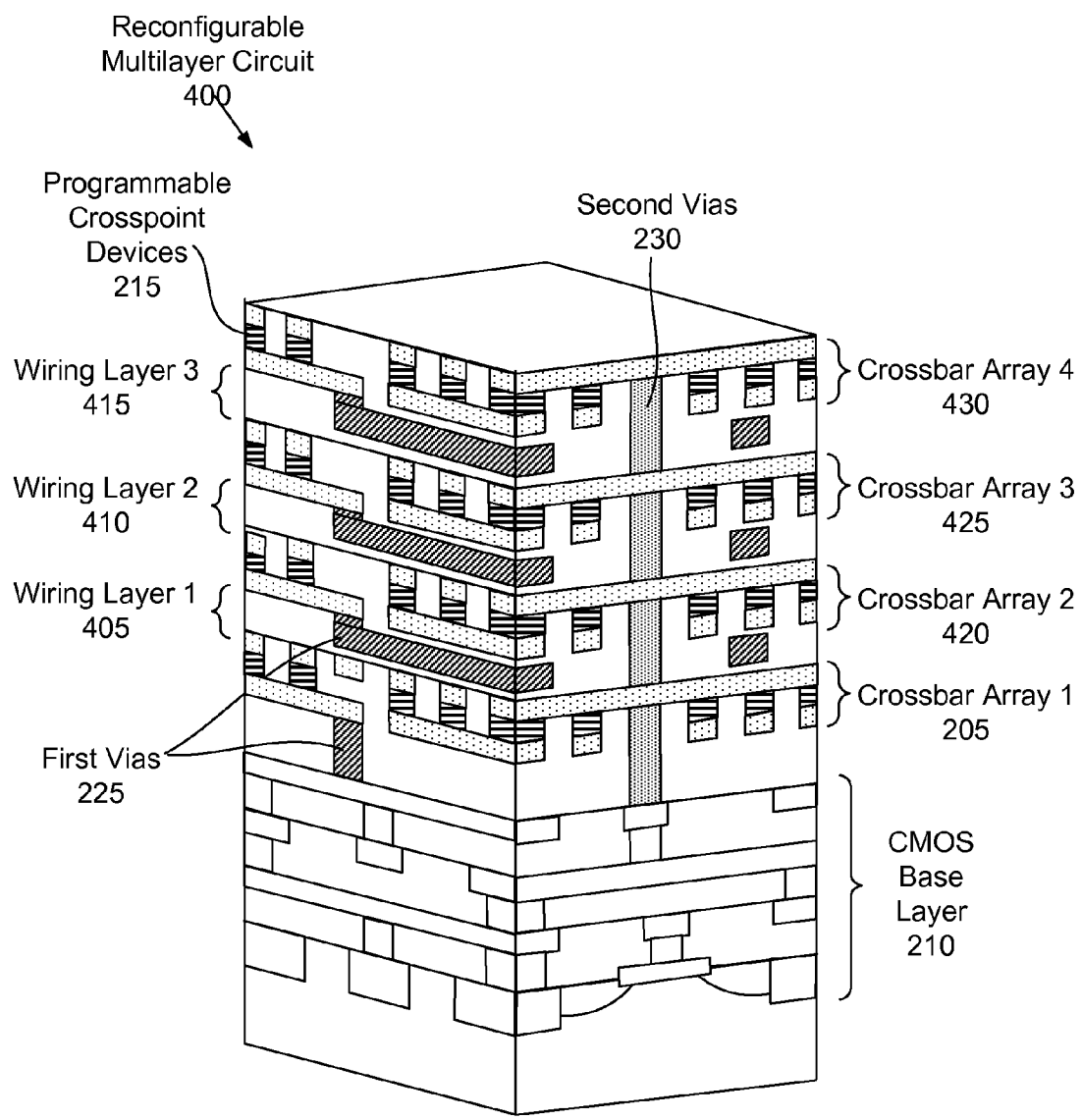
FIG. 4 is cross-sectional diagram of an illustrative multilayer circuit which includes a CMOS layer and multiple crossbar arrays, according to one embodiment of principles described herein.

FIG. 4 is cross-sectional diagram of an illustrative multilayer circuit (400) which includes a CMOS layer (210) and multiple crossbar arrays (205, 420, 425, 430). According to one illustrative embodiment, a number of wiring layers (405, 410, 415) are interposed between successive crossbar arrays (205, 420, 425, 430). The second vias (330) pass through all the crossbar arrays (205, 420, 425, 430) and wiring layers (405, 410, 415) as a vertical column. In contrast, the locations of the first vias (225) are shifted in each successive wiring layer (405, 410, 415). This allows a set of first vias (225) which participate in addressing programmable crosspoint devices (215) along a first upper crossbar segment (222, FIG. 3) to be used in addressing a different set of programmable crosspoint devices in the overlying crossbar array.

According to one illustrative embodiment, the programmable crosspoint devices (215) may be memristive junctions. Memristive junctions include a memristive matrix which is interposed between intersecting crossbar segments. The characteristics of these memristive junctions may vary between crossbar arrays. For example, a crossbar array 1 (205) may have memristive junctions with one particular matrix/dopant combination and crossbar array 2 (420) may have a different matrix/dopant combination. Other elements within the memristive junctions could also change between or within the crossbar arrays. For example, different species of mobile ions and/or different electrode materials with different work functions can be incorporated to increase functionality and flexibility of the multilayer circuit.

Figure 5:
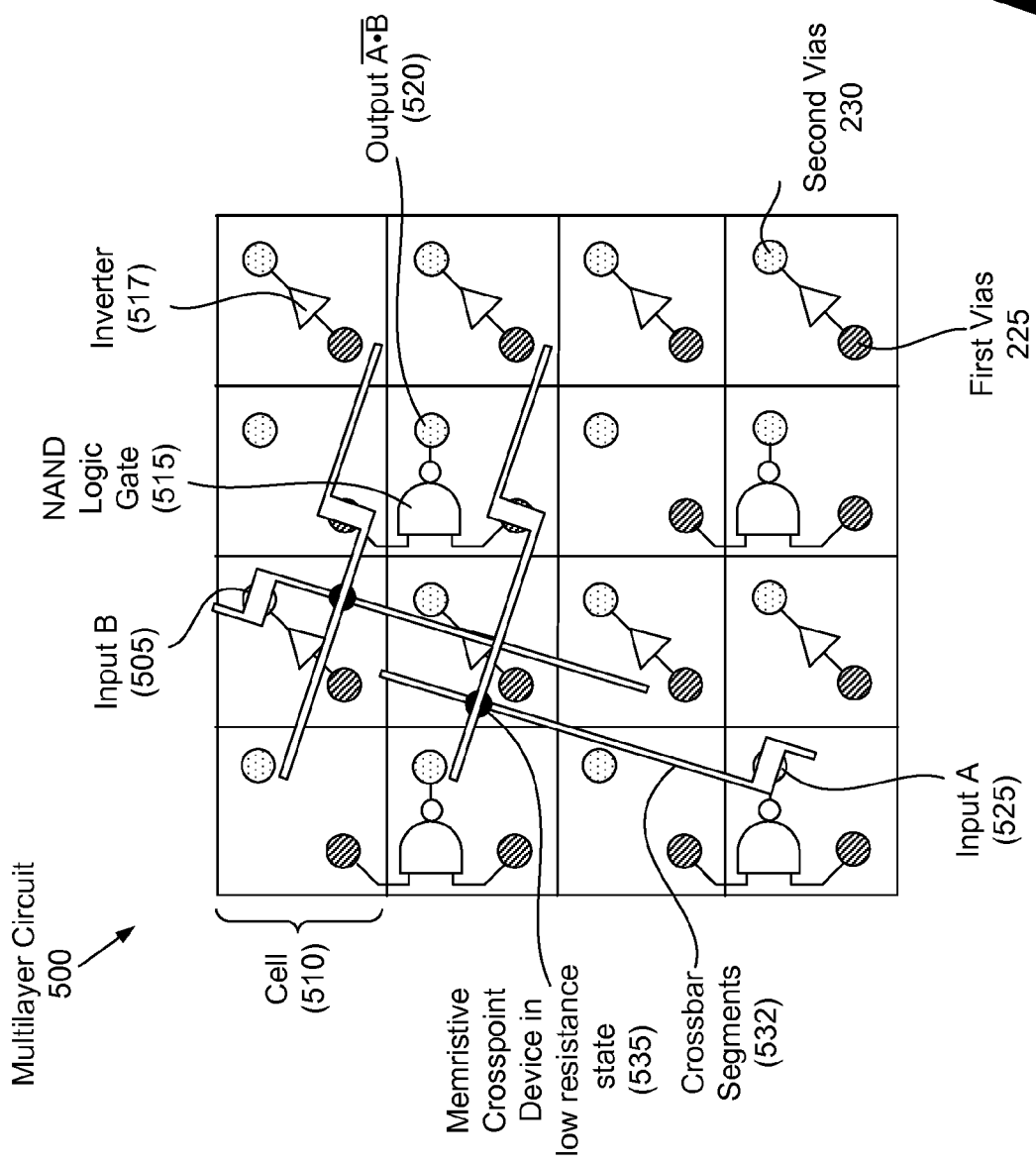
FIG. 5 is a diagram showing illustrative interconnections formed in a memristive crossbar array to selectively form a logical device in an underlying CMOS layer, according to one embodiment of principles described herein.

FIG. 5 is a top view of selected elements within a reconfigurable multilayer circuit (500). To more clearly illustrate the interconnectivity formed in an overlying crossbar array to create a logic device in the underlying CMOS layer, both CMOS elements and crossbar elements have been shown. However, in an actual circuit the CMOS elements and crossbar element may be separated by one or more dielectric layers. Additionally, only the elements which are directly involved in making interconnections between the CMOS logic devices in the considered example are illustrated. A variety of other elements, which are not illustrated, could be present in a reconfigurable multilayer circuit (500).

According to one illustrative embodiment, the multilayer circuit (500) includes an underlying CMOS layer (210, FIG. 4). The CMOS layer (210, FIG. 4) may have a number of internal structures and layers. According to one illustrative embodiment, the CMOS layer (210, FIG. 4) includes a number of logic gates (515). Logic gates are typically configured to accept one or more inputs and perform a logical operation to produce an output. A variety of logic gates could be incorporated into the CMOS layer. By way of example and not limitation, the logic gates could include NAND, NOR, AND, OR, NOT (also known as an inverter), XOR, and XNOR gates. According to one illustrative embodiment, the CMOS layer may include NAND and/or NOR logic gates and the overlying memristive layers could be used to appropriately connect these gates to create other types of Boolean logic gates and other more complex logic structures. In the illustrative embodiment which is shown in FIG. 5, the CMOS layer includes number of NAND gates which are shown as rectangles with one rounded side. The CMOS layer also includes a number of inverters which are shown as triangles.

The logic gates (515, 517) are formed in the CMOS layer and connected to the vertical vias (225, 230) which pass upward into the overlying crossbar arrays. As discussed above, the crossbar array (205, FIG. 4) includes a number of crossbar segments (532) which connect to the vias (225, 230). The crossbar segments (532) may have variety of shapes, lengths, and cross-sections. In the illustrative embodiment shown in FIG. 5, the crossbar segments (532) have a relatively large central pad which connects to an underlying via, with narrower traces extending from opposite corners of the central pad. At intersections between the crossbar segments (532), a memristive crosspoint device (535) formed. As discussed above, the resistance of the memristive crosspoint device (535) can be programmed into a variety of states, including a high resistance state and a low resistance state. In a low resistance state, the memristive crosspoint device (535) forms an electrical connection between the two crossbar segments through which an electrical signal can flow. In the high resistance state, the memristive crosspoint device (535) substantially prevents the flow of electricity between the two intersecting crossbar segments (532). These memristive crosspoint devices (535) can be selectively programmed to create a desired logical element.

In the example shown in FIG. 5, input A (525) is directed through several crossbar segments (532), which are connected by a crosspoint device (535) with a low resistance, to an input of a NAND logic gate (515). Similarly, the input B (505) is directed through several crossbar segments to another input of a NAND logic gate (515). The NAND logic gate accepts input A and input B and outputs the logical result, which is $\overline{A \cdot B}$ (read as A NAND B). This output (520) is a digital "1" for all cases except where both input A and input B are "1". In this case, the output (520) is digital "0."

As can be seen from FIG. 5, the inputs to the NAND logic gate (515) could be the outputs of a variety of other elements. For example, input A (525) is illustrated as originating at a via which is connected to the output of another NAND logic gate. Similarly, input B (505) originates from a via connected to the output on an inverter. These originating elements, in turn, could receive inputs from other devices.

Interconnections of a number of CMOS gates or other elements can create a variety of higher level constructs such as multiplexers, demultiplexers, adders, and compressors with various compression ratios. Various illustrative applications and examples of multilayer circuits which incorporate crossbar interconnections are given in "Nano/CMOS architectures using a field-programmable nanowire interconnect", Gregory Snider et al., Nanotechnology 18, 035204 (2007) which is incorporated by reference herein in its entirety.

Figure 6:
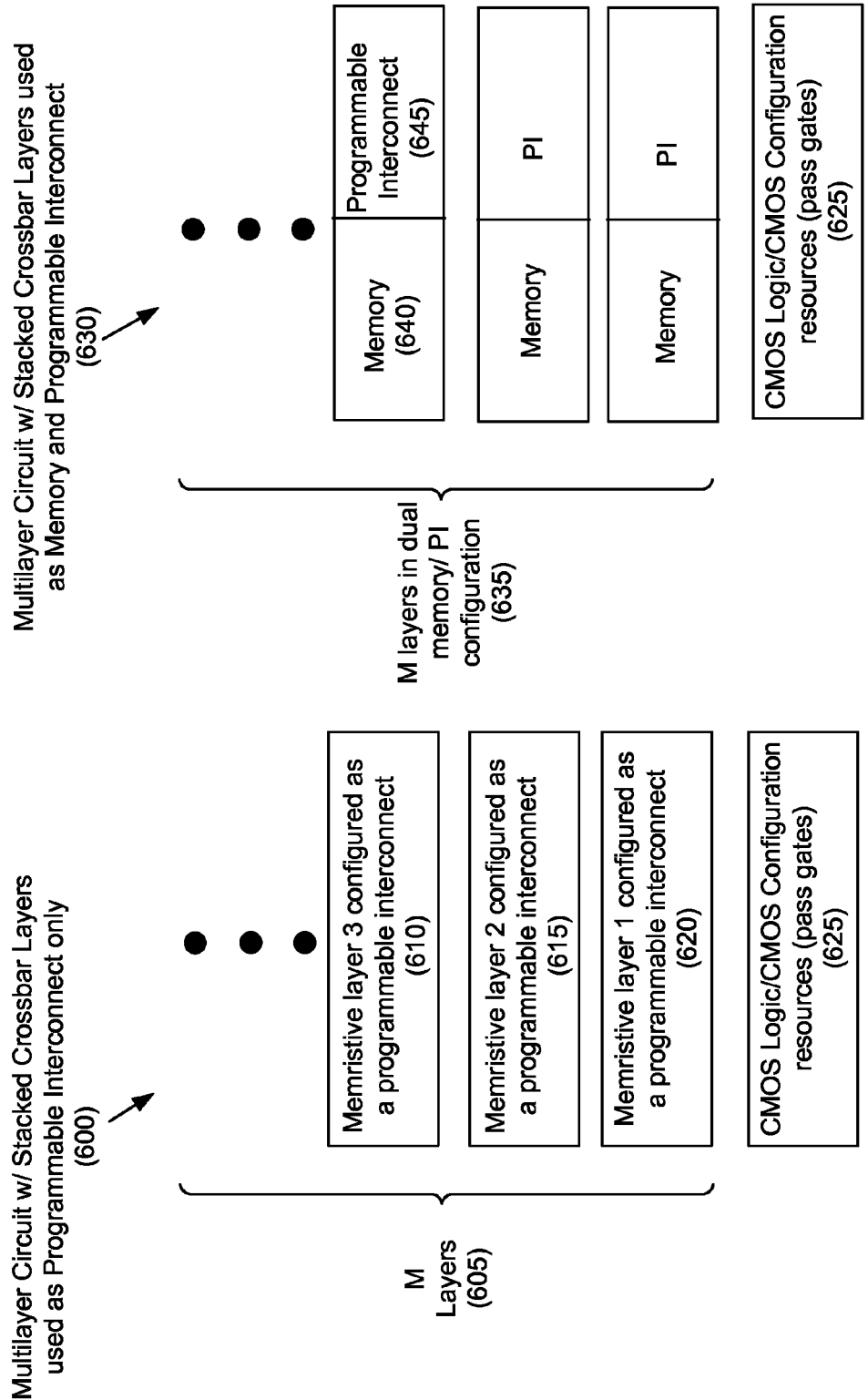
FIGS. 6A and 6B are diagrams showing various illustrative configurations of memristive layers within a reconfigurable multilayer circuit, according to one embodiment of principles described herein.

FIG. 6A shows a multilayer circuit with a CMOS layer (625) and M stacked crossbar layers (610, 615, 620). In this illustrative embodiment, the stacked crossbar layers (610, 615, 620) are configured to make reconfigurable interconnections between devices in the CMOS layer (625). The M layers (605) act together to form a versatile interconnection fabric. For any M layers, the maximum number of connections which can be made to a given logic input is given by:

$$C\max = M * \left(\frac{Pbar}{Pvia}\right)^2 \quad \text{Eq. 2}$$

Where:
Cmax=the maximum number of connections to a given logical input.
M=number of layers
Pbar=pitch of the crossbars, also equal to 2 F from Eq. 1
Pvia=pitch of the vias, also equal to 2 βF from Eq. 1

The greater the number of available connections, the more versatile the interconnection fabric. According to one illustrative embodiment, the ratio between Pbar and Pvia should be at least 10. Depending on the application, one or more of these connections can be selectively connected to the logical input to form the desired logical device.

As can be seen from Eq. 1, maximizing the connectivity created by a given crossbar layer can be accomplished by decreasing the pitch between the vias and/or by increasing the pitch between the crossbars. Decreasing the pitch between the vias results in larger CMOS cell sizes and less dense circuitry. This is typically viewed as undesirable because the planar size of the circuit increases.

Increasing the pitch of the crossbars can be accomplished until one or more manufacturing constraints are reached. For example, at some point increasing the pitch of the crossbars may become counter productive because it results in a substantial increase in defects or cost.

Increasing the number of crossbar layers in the multilayer circuit can be very effective in increasing the connectivity of the fabric. By applying Eq. 1, the maximum number of connections for a given configuration can be calculated. For example, if the ratio between Pbar and Pvia is 10 for each layer, then a single layer provides 100 possible connections to each input, two layers would provide a maximum of 200 possible connections, three layers would provide a maximum of 300 possible connections, and so forth.

The multiple memristive layers can provide a variety of other advantages and capabilities to the multilayer circuit. The memristive crossbar arrays can be used as fast, nonvolatile memory arrays. When used as a memory array, the memristive crosspoint devices are programmed to a resistive state which corresponds to data to be stored. The memristive crosspoint devices retain the resistive state through multiple read cycles. A second programming voltage later can be used to alter or rewrite the state of the memristive crosspoint devices. According to one illustrative embodiment, the density of memory within crossbar array may exceed the density of conventional NAND FLASH by an order of magnitude.

FIG. 6B is a diagram of a multilayer circuit with M layers (635) which each layer is divided into a memory portion (640) and a programmable interconnect portion (645). The incorporation of memory (640) within the memristive layers can significantly improve the performance and flexibility of the circuit (630). According to one illustrative embodiment, a portion of the memristive layers which overlay the CMOS layer (625) may be configured as memory (640), while the balance of the each memristive layer is configured as programmable interconnects (645).

The configuration illustrated in FIG. 6B is only one illustrative embodiment of ways in which the memristive layers could be configured. According to one alternative embodiment, the memristive layers may be individually configured and have varying amounts of memory. The memory need not be contiguously located within a memristive layer, but may be distributed as desired throughout the layer. For example, where the memristive interconnects are used to create a plurality of hypercells, small segments of memory could be included to provide local memory to each hypercell.

Figure 7:
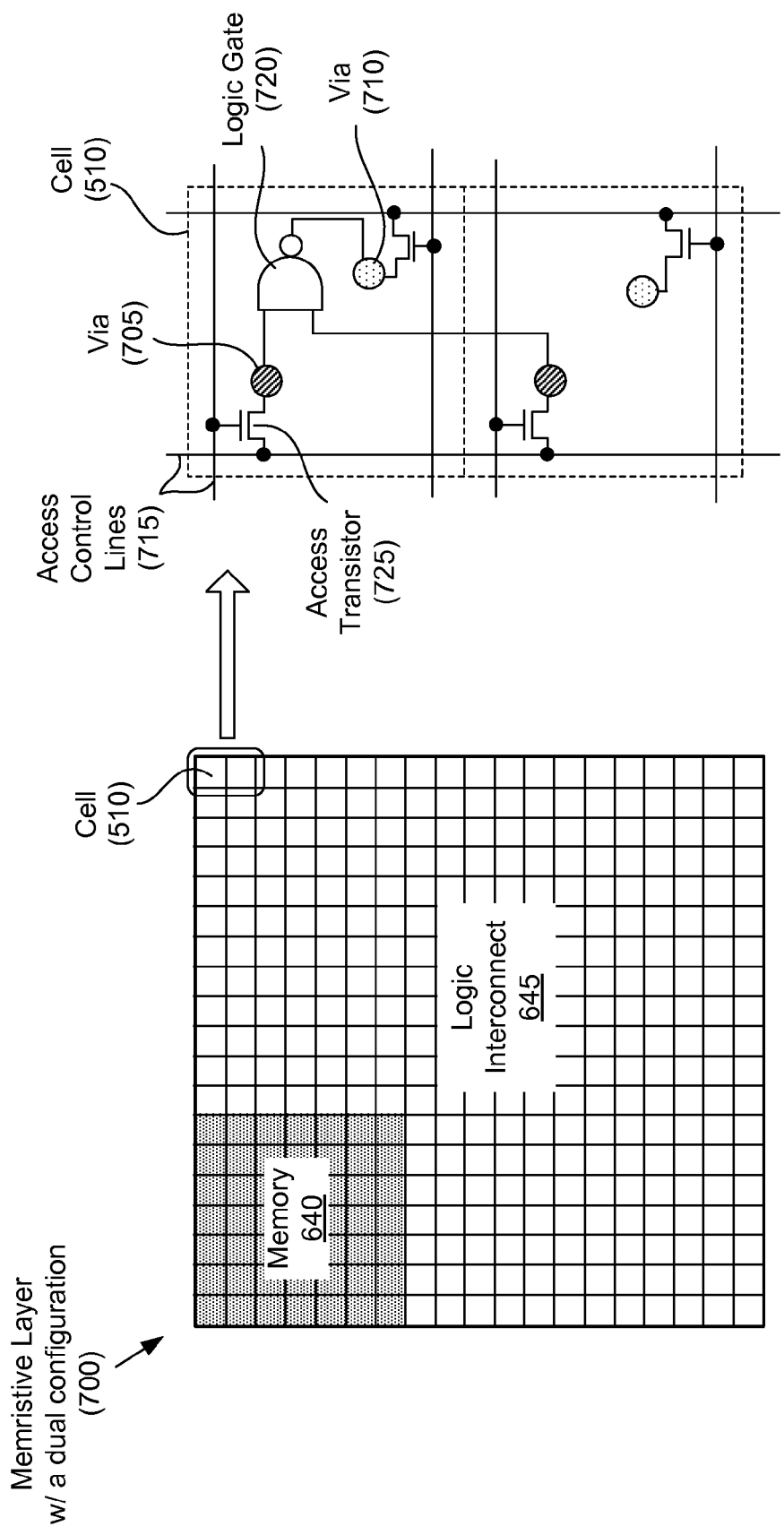
FIGS. 7A and 7B are diagrams showing one illustrative configuration of a memristive layer, according to one embodiment of principles described herein.

FIG. 7A illustrates a memristive layer (700) which has a dual configuration. According to one illustrative embodiment, the memristive layer (700) is divided into a number of cells (510) which correspond to size of the underlying CMOS access cells. For purposes of illustration, the size of the CMOS cells has been greatly enlarged. The shaded portion in the upper left of the memristive layer (700) has been configured as memory (640). The remaining portions of the memristive layer (700) are configured to serve as logical interconnects (645) for the underlying CMOS layer.

FIG. 7B shows an enlargement of two cells (510) within the memristive layer (700). The outlines of the cells (510) are shown as dotted boxes in FIG. 7B. According to one illustrative embodiment, a cell (510) is converted from a logic interconnect to a memory cell by disabling its associated logic gate (720). In one embodiment, the logic gate (720) may be disabled in the CMOS layer (210, FIG. 4) by disconnecting one or more inputs or outputs of the logic gate (720). In addition, a number of access transistors (725) could be formed between access control lines and the vias (705, 710). By applying an appropriate voltage to the access transistors, any crosspoint device can be uniquely accessed. Several illustrative examples of architectures for uniquely accessing crosspoint devices are described in PCT Application No. PCT/US2009/039666, to Dmitri Strukov et al., entitled "Three Dimensional Multilayer Circuit," filed Apr. 6, 2009, which was incorporated by reference above.

A variety of other techniques could be used to disable the logic device (720). For example, the output of the logic gate (720) could be disconnected from the via, thereby rendering the logic gate unable to communicate an output. Additionally or alternatively, the power supply which operates the logic gate (720) could be disconnected.

After the memory (640) has been configured, it can be accessed and programmed in a variety of ways. According to one illustrative embodiment, banks of thin film transistors are used in conjunction with layer select signals to route read and write signals to the appropriate layer.

In addition to configuring portions of the memristive layers as memory, a number of other adjustments can be made in the configuration of the multilayer circuit to increase its performance and/or flexibility. One performance challenge in designing crossbar architectures relates to the size and length of the various crossbar segments which make up the crossbar array. For the greater density, it is desirable to use small cross-section segments. For greater connectivity, it can be desirable for the segments to be relatively long. The longer the segment, the more perpendicular crossbars the segment intersects. This increases the connectivity capabilities of the crossbar layer. A competing consideration is that long, small cross-section segments have a high electrical resistance. This high electrical resistance can reduce the speed at which the multilayer circuit can operate.

Figure 8:
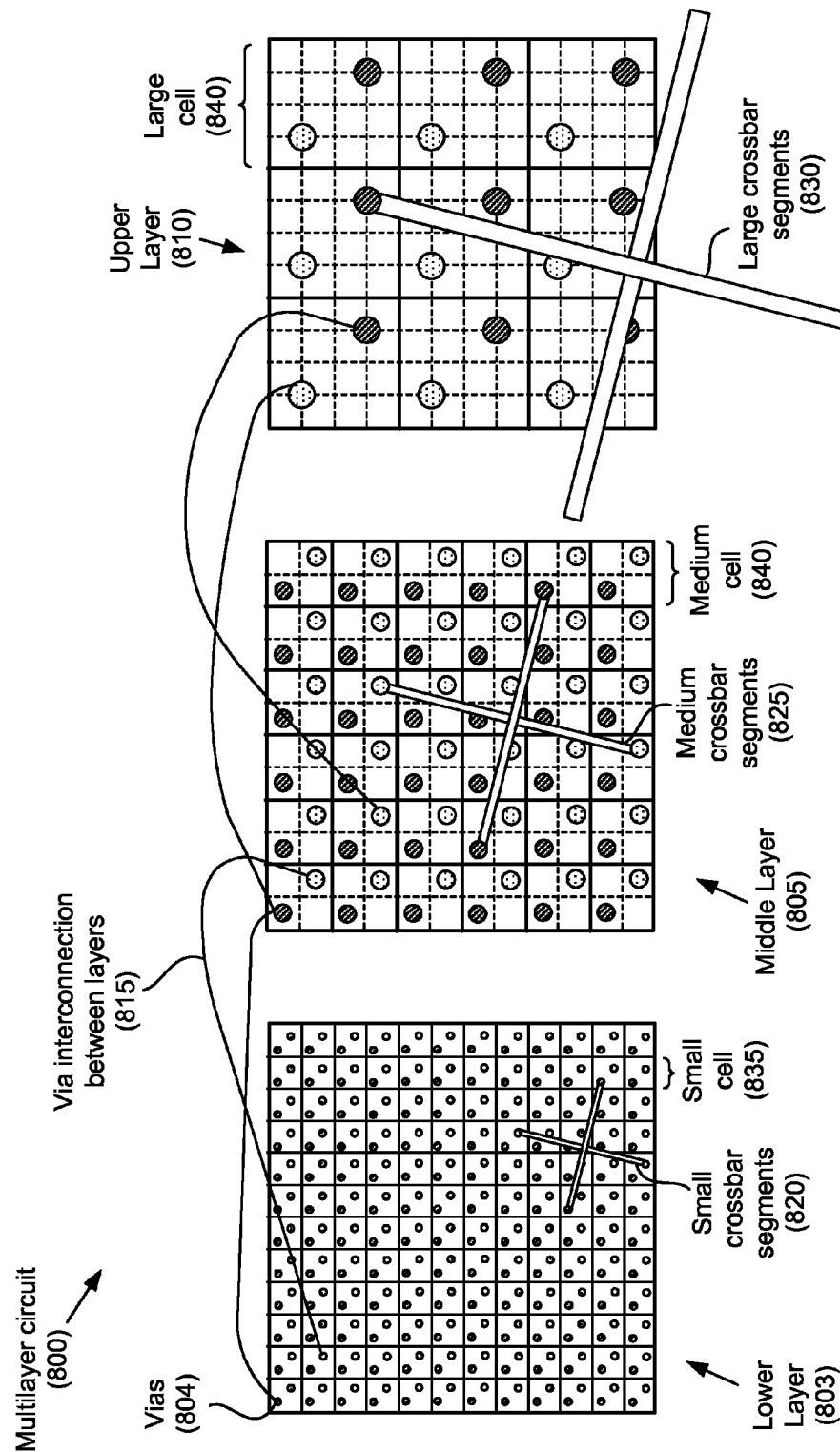
FIG. 8 is a diagram of an illustrative multilayer circuit with multiple layers which have mutually different scaling, according to one embodiment of principles described herein.

According to one illustrative embodiment, changing the size of a unit cell in the various layers of a multilayer circuit can extend the connectivity of the interconnection fabric without substantially increasing the electrical resistance of the crossbar segments. FIG. 8 is a diagram of an illustrative multilayer circuit (800) in which the size of the unit cell (835, 840, 845) changes between layers (803, 805, 810). A lower crossbar array layer (803) includes relatively small unit cells (835) and crossbar segments (820). As previously described, each cell (835) includes two vias (804).

According to one illustrative embodiment, only a portion of the vias in the lower layer (803) continues upward into the middle layer (805). The via connections (815) schematically illustrate the connections between the various layers. As can be seen from FIG. 8, only a portion of the vias from the lower layer (803) continues into the middle crossbar array layer (805). Consequently, the unit cell size in the middle layer (805) can be larger than the cell size in the lower layer (803). In the middle layer (805), the original small cells are outlined with dashed lines and the medium cell cells (840) are outlined with solid lines. In this illustrative embodiment, four small cells (835) are subsumed into a single medium cell (840). Of the eight vias within the four small cells, only two pass upward into the middle layer (805).

The larger size of the medium cells (840) results in medium crossbar segments (825) with larger cross-sections. These medium crossbar segments (825) extend a greater linear distance than the small crossbar segments (820) in the lower layer (803). This allows the possibility of interconnections between more remote logical elements in the underlying CMOS layer.

According to one illustrative embodiment, the greater cross-section of the medium crossbar segments (825) compensates for the greater length of the medium crossbar segments (825) and results in the crossbar segments (820, 825) in the lower layer (803) and middle layer (805) having approximately the same resistance. Consequently, the speed at which the multilayer circuit can operate is not reduced because of higher resistance crossbar segments.

The unit cell size can be further increased in subsequent layers. For example, in an upper layer (810), the unit cell size can again be increased by selecting only a portion of the vias in the middle layer (805) to continue upward into the upper layer (810). According to one illustrative embodiment, the large cell (840) covers the same area as four of the medium cells (840). The large crossbar segments (830) have correspondingly greater cross sections and length.

FIG. 8 is only one illustrative embodiment of a multilayer circuit which includes crossbar layers with varying unit cell sizes and crossbar segments. For purposes of illustration, the lengths and densities of the crossbar segments have been shown significantly less than could be used in an actual implementation of a crossbar array. Additionally, although FIG. 8 illustrates only three layers, the multilayer circuit may have a greater number of layers. Additionally, the multilayer circuit may include a wide variety of unit cell sizes within these layers. The change between unit cells sizes need not occur in sequential layers. For example, the bottom most three layers may have the smallest unit cells and crossbar segments. The transition may then be made to a larger cell size in the next layer. This larger cell size may be continued for a number of layers before transitioning to a different unit cell size.

The description and figures above describe various illustrative embodiments of a multilayer circuit. This multilayer circuit can be configured and reconfigured to perform a variety of tasks. By way of example and not limitation, the multilayer circuit may be used as a digital signal processor which supports various sensors such as imaging focal plane arrays. The rapid evolution of focal plane arrays in resolution, frame rate and dynamic range has dramatically increased the need for high speed computation of image data. These low level tasks may include spatial filtering, edge detection, feature extraction and other tasks.

Figure 9:
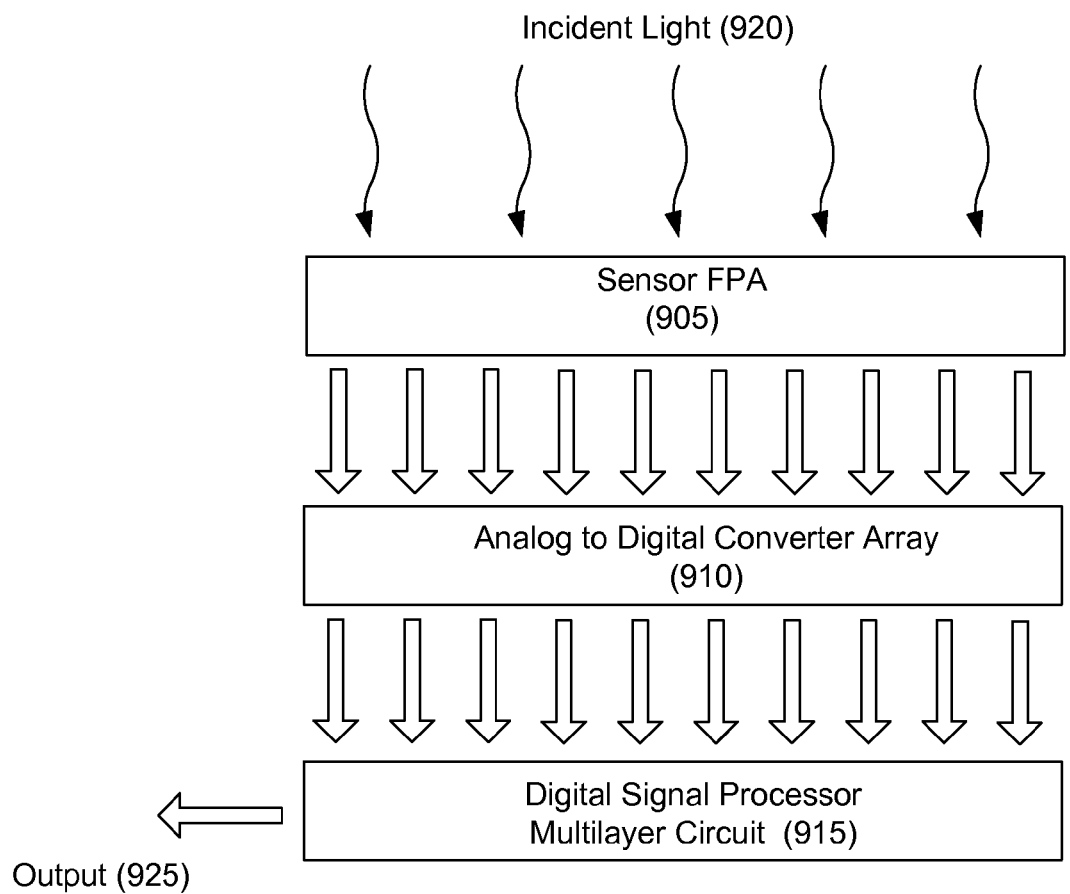
FIG. 9 is a diagram of an illustrative multilayer circuit which is configured to be used a digital signal processor, according to one embodiment of principles described herein.

FIG. 9 is diagram of an illustrative multilayer circuit (915) which is configured to perform various digital signal processing (DSP) tasks in parallel on all pixels in an array of image data. Incident light (920) is focused on a sensor focal plane array (FPA) (905). The light may contain a range of frequencies and patterns within those frequencies. The sensor FPA (905) converts the light into analog electrical signals which are transferred in parallel or quasi-parallel to an analog-to-digital converter array (910). The analog-to-digital converter array (910) converts the analog electrical signals into digital electrical signals. These digital electrical signals are passed to the DSP multilayer circuit (915). The digital electrical signals may be stored within the multilayer circuit. According to one illustrative embodiment, the changing light patterns which are captured in the digital signals may change the logic and memory configuration of the multilayer circuit (915). This input-triggered reconfiguration may be useful in telecommunications, neural networks, micro-sensor applications, and other applications. The DSP multilayer circuit (915) then generates an output (925).

According to one illustrative embodiment, the DSP multilayer circuit (915) can be configured to perform simultaneous operations on all the digital signals received. In some configurations, the density of operational cells within the DSP multilayer circuit (915) may be higher than the pixel density of the sensor FPA (905). Consequently, the DSP multilayer circuit (915) may have a planar footprint which the same or smaller than the sensor FPA (905). Additionally, because of three dimensional nature of the multilayer circuit (915), this density may be achieved with relatively large cross-section crossbar layers. These crossbar layers may be created using conventional lithographic processes.

In some embodiments, the DSP multilayer circuit (915) may have significant advantages over conventional Field Programmable Gate Array (FPGA) solutions. FPGAs have several limitations. In some FPGA implementations, the elements which support the reconfigurability of the FPGA consume approximately 90% of the total surface area of the FPGA. In contrast, in the DSP multilayer circuit (915) the interconnectivity is lifted off the CMOS layer and into the overlying memristive crossbar layers. This may allow the DSP multilayer circuit (915) to perform its DSP related operations on a chip with a planar area which is equal to, or smaller than, the focal plane array.

Increasing the number of gates of an FPGA chip causes an exponential growth of the switching/routing infrastructure on the chip. This limits the scalability of an FPGA system. In contrast, the switching/routing needs of the multilayer chip can be met by increasing the number of crossbar layers within the multilayer circuit. The same CMOS control circuitry used for configuring the overlying layers can be used to configure the additional layers. Consequently, increasing the number of layers does not require increasing the planar area of the multilayer chip.

Additionally, contemporary FPGAs have fixed hardware for memory and wiring which is typically defined by the worst case demands for targeted applications. This implies poor resource utilization by all but the most demanding applications. For example, if an application does not use memory at all, the fixed memory provided by the FPGA is wasted. However, in the multilayer circuit (915), portions of the overlying crossbar arrays can be dynamically allocated to act either memory or as a programmable interconnect fabric. This provides for high utilization of the multilayer circuit, very dense memory storage resource within the circuit, and adaptability to a wide variety of applications. Further, the DSP multilayer circuit (915) may be power/cost efficient and have extremely low latencies for in-situ low level signal processing tasks such as correlation or convolution of image data generated by a focal plane.

Various illustrative applications and examples of multilayer circuits used in image processing are given in "Reconfigurable Hybrid CMOS/Nanodevice Circuits for Image Processing" Dmitri Strukov et al., IEEE Tran. Nanotechnology, vol. 6, issue 6, pgs. 696-710 (2007) which is incorporated by reference herein in its entirety.

In sum, the reconfigurable multilayer circuit described above is a hybrid of CMOS circuitry and crossbar arrays which dramatically improves the density and flexibility of field programmable logic.

The preceding description has been presented only to illustrate and describe embodiments and examples of the principles described. This description is not intended to be exhaustive or to limit these principles to any precise form disclosed. Many modifications and variations are possible in light of the above teaching.

What is claimed is:

1. A reconfigurable multilayer circuit comprising:
   a CMOS layer, the CMOS layer comprising control circuitry and logic gates; and
   at least two crossbar arrays configured to overlie the CMOS layer; the at least two crossbar arrays being configured by the control circuitry and forming reconfigurable interconnections between the logic gates; in which a first crossbar array comprises a first unit cell and a second crossbar array comprises a second unit cell, the first unit cell being smaller than the second unit cell, in which the first unit cell and the second unit cell comprise each comprise two vias to address the reconfigurable interconnections.

2. The circuit of claim 1, in which the at least two crossbar arrays comprise:
   a plurality of intersecting crossbar segments; and
   memristive crosspoint devices configured to be interposed between the plurality of intersecting crossbar segments.

3. The circuit of claim 2, in which a portion of the memristive cross point devices are configured as memory elements and a portion of the memristive crosspoint devices are configured as reconfigurable interconnections.

4. The circuit of claim 1, in which a portion of a crossbar array is configured to serve as memory, the logic gates underlying the memory being disabled.

5. The circuit of claim 1, in which the first crossbar array is vertically positioned in the multilayer circuit above the CMOS layer and below the second crossbar array.

6. The circuit of claim 1, in which the first crossbar array comprises a first number of vias and the second crossbar array comprises a second number of vias, the first number of vias being greater than the second number of vias; the first unit cell and second unit cell having an equal number of vias.

7. The circuit of claim 1, in which a cross-sectional area and length of crossbar segments within the first crossbar array are smaller than a cross-sectional area and length of crossbar segments in the second crossbar array.

8. The circuit of claim 1, in which longer crossbar segments have larger cross-sectional areas and shorter crossbar segments have smaller cross-sectional areas, such that the longer crossbar segments have an electrical resistance which is substantially equal to or less than the shorter crossbar segments.

9. The circuit of claim 1, in which the multilayer circuit is configured to store and process data generated by each pixel in a focal plane array in parallel.

10. The circuit of claim 9, in which the multilayer circuit is configured to a parallel convolution operation for data generated by each pixel in a focal plane array in parallel.

11. The circuit of claim 9, in which the multilayer circuit has a planar area which is equal to or smaller than the focal plane array.

12. A reconfigurable multilayer circuit comprising:
    a base layer, the base layer comprising vias, control circuitry, and logic elements; the logic elements being connected to the vias; and
    memristive crossbar arrays configured to overlie the base layer; the memristive crossbar arrays being configured by the control circuitry and forming reconfigurable interconnections between the logic elements by altering a resistance of memristive crosspoint devices, in which a memristive crossbar array is configured with a memory portion and an interconnection portion, logic elements underlying the memory portion being disabled.

13. The circuit of claim 12, in which a first crossbar array has a smaller unit cell and smaller crossbar segments than a second overlying crossbar array, in which a portion of vias within the first crossbar array do not extend into the second overlying crossbar array.

14. A reconfigurable multilayer circuit comprising:
    a CMOS layer, the CMOS layer comprising control circuitry and logic gates; and
    a first crossbar array comprising a first unit cell comprising two vias connected to a logic gate and the control circuitry, the two vias to address reconfigurable interconnections in the first crossbar array;
    a second crossbar array comprising a second unit cell comprising a two vias connected to a logic gate and the control circuitry;
    in which a portion of the first crossbar array is configured as nonvolatile memory with the logic gates disabled that underlie unit cells configured as nonvolatile memory; and
    in which a portion of the second crossbar array is configured as nonvolatile memory with the logic gates disabled that underlie unit cells configured as nonvolatile memory.

15. The circuit of claim 14, wherein the portion of the first crossbar array that is configured as nonvolatile memory is dynamically allocated during operation of the circuit to act as a programmable interconnect fabric.

16. The circuit of claim 14, in which the first crossbar array comprises a smaller unit cell and smaller crossbar segments than the second overlying crossbar array, in which a portion of vias within the first crossbar array do not extend into the second overlying crossbar array, which a cross-sectional area and length of crossbar segments within the first crossbar array are smaller than a cross-sectional area and length of crossbar segments in the second crossbar array, in which the longer crossbar segments have an electrical resistance which is substantially equal to or less than the shorter crossbar segments.

* * * * *

UNITED STATES PATENT AND TRADEMARK OFFICE
CERTIFICATE OF CORRECTION

PATENT NO.         : 8,530,880 B2                              Page 1 of 1
APPLICATION NO.    : 13/259168
DATED              : September 10, 2013
INVENTOR(S)        : Dmitri Borisovich Strukov et al.

It is certified that error appears in the above-identified patent and that said Letters Patent is hereby corrected as shown below:

In the Claims:

In column 11, line 42, in Claim 1, delete "cell comprise" and insert -- cell --, therefor.

Signed and Sealed this
Seventeenth Day of December, 2013

Margaret A. Focarino
*Commissioner for Patents of the United States Patent and Trademark Office*